United States Patent
Seong et al.

(10) Patent No.: US 7,358,541 B2
(45) Date of Patent: Apr. 15, 2008

(54) FLIP-CHIP LIGHT EMITTING DIODE AND METHOD OF MANUFACTURING THE SAME

(75) Inventors: Tae-yeon Seong, Gwangju-si (KR);
June-o Song, Gwangju-si (KR);
Dong-seok Leem, Gwangju-si (KR)

(73) Assignees: Samsung Electronics Co., Ltd., Suwon-Si, Gyeonggi-Do (KR);
Gwangju Institute of Science and Technology, Buk-Gu, Gwangju-Si (KR)

( * ) Notice: Subject to any disclaimer, the term of this patent is extended or adjusted under 35 U.S.C. 154(b) by 337 days.

(21) Appl. No.: 11/002,797

(22) Filed: Dec. 3, 2004

(65) Prior Publication Data

US 2005/0133797 A1 Jun. 23, 2005

(30) Foreign Application Priority Data

Dec. 23, 2003 (KR) .................. 10-2003-0095544

(51) Int. Cl.
*H01L 29/22* (2006.01)
*H01L 29/227* (2006.01)
*H01L 33/00* (2006.01)

(52) U.S. Cl. ........................... 257/98; 257/778
(58) Field of Classification Search ............... 257/79, 257/778, 98, 81, 99
See application file for complete search history.

(56) References Cited

U.S. PATENT DOCUMENTS 7,205,576 B2* 4/2007 Song et al. ............... 257/94

2002/0171087 A1 11/2002 Krames et al.
2003/0205712 A1* 11/2003 Bhat et al. ............... 257/79
2006/0081867 A1* 4/2006 Kim et al. ............... 257/99

FOREIGN PATENT DOCUMENTS

| EP | 0 733 931 A2 | 9/1996 |
| JP | 11-191641 | 7/1999 |
| JP | 2000-164928 | 6/2000 |
| JP | 2002-151739 | 5/2002 |

OTHER PUBLICATIONS

Korean Office Action dated Oct. 27, 2005.
Official Action issued by the Patent Office of the People's Republic of China in corresponding Chinese Patent Application No. 200410103926.X; Mar. 9, 2007; and English translation thereof.

* cited by examiner

*Primary Examiner*—S. V. Clark
(74) *Attorney, Agent, or Firm*—Buchanan Ingersoll & Rooney PC

(57) ABSTRACT

Provided are a flip-chip light emitting diode (FCLED) and a method of manufacturing the same. The provided FCLED is formed by sequentially depositing an n-type cladding layer, an active layer, a p-type cladding layer, and a reflective layer on a substrate. The reflective layer is formed of the alloy of silver to which a solute element is added. According to the provided FCLED and the method of manufacturing the same, a thermal stability is improved to improve an ohmic contact characteristic to a p-type cladding layer, thus a wire bonding efficiency and a yield are improved when packaging the provided FCLED. In addition, the light emitting efficiency and the lifespan of the provided FCLED are improved due to a low specific-contact resistance and an excellent current-voltage characteristic.

4 Claims, 3 Drawing Sheets

FLIP-CHIP LIGHT EMITTING DIODE AND METHOD OF MANUFACTURING THE SAME

BACKGROUND OF THE INVENTION

This application claims the priority of Korean Patent Application No. 2003-95544, filed on Dec. 23, 2003, in the Korean Intellectual Property Office, the disclosure of which is incorporated herein in its entirety by reference.

1. Field of the Invention

The present invention relates to a flip-chip light emitting diode (FCLED) and a method of manufacturing the same, and more particularly, to an FCLED having an electrode structure with an improved thermal stability and a method of manufacturing the same.

2. Description of the Related Art

An ohmic contact structure between a semiconductor and an electrode is important to realize a light emitting diode, such as a laser diode or a light emitting diode using a nitride semiconductor, for example, a gallium nitride (GaN) semiconductor of generating blue, green, and ultraviolet rays. A conventional GaN based light emitting diode, which is commercially used nowadays, is formed of an insulating sapphire ($Al_2O_3$) substrate.

Such a GaN based light emitting diode is divided into a top-emitting light emitting diode (TLED) and a flip-chip light emitting diode (FCLED).

A TLED emits light through an ohmic electrode layer, which contacts a p-type cladding layer.

In addition, a TLED has problems of deteriorated electric characteristics, such as a low current injection and a current spreading due to the characteristics of a p-type cladding layer having a low hole concentration. However, such problems can be solved by developing a transparent ohmic contact electrode having a low sheet resistance.

The TLED uses an oxidized semi-transparent nickel (Ni)/gold (Au) layer as a transition metal based metal layer. In this case, an example of the transition metal is Ni.

Such a Ni based metal layer is used as a semi-transparent ohmic contact layer having low specific-contact resistance of $10^{-3}$ to $10^{-4}$ $\Omega/cm^2$.

When a Ni/Au metal layer is annealed at a temperature of 500 to 600° C. under an oxygen atmosphere, an island shaped nickel oxide (NiO) as a p-type semiconductor oxide is formed on the interface between p-type GaN and Ni due to the low specific-contact resistance, thus a Schottky barrier height (SBH) is lowered. In addition, holes, in other words, majority carriers, are easily supplied to the surface of GaN to increase an effective carrier concentration. On the other hand, when a Ni/Au metal layer is annealed after contacting p-type GaN, a Mg—H metal compound is removed and a reactivation of increasing a magnesium dopant concentration on the surface of GaN occurs. Thus, the effective carrier concentration becomes higher than $10^{19}$ on the surface of the p-type GaN, and a tunneling conduction occurs between the p-type GaN and an electrode layer, resulting in the generation of an ohmic conductive characteristic.

In this case, a TLED using a semi-transparent electrode layer of Ni/Au has a low light utility efficiency, thus it is difficult to realize a light emitting diode of high capacity and luminance.

Nowadays, an FCLED using a material having high reflectivity, such as silver (Ag), silver oxide ($Ag_2O$), aluminum (Al), or rhodium (Rh), is developed to realize a light emitting diode of high capacity and luminance.

Such a material has high reflectivity to generate a high light emitting efficiency for a short time; however, such a material has a low work function, resulting in the difficulty in forming an ohmic contact having low resistivity. As a result, the lifespan of a light emitting diode is reduced. In addition, such a material cannot be adhered to GaN well, thus reliability of the light emitting diode is deteriorated.

More specifically, Al has a low work function and generates an aluminum nitride (AlN) even at a low temperature, thus it is difficult to form an ohmic contact with p-type GaN.

Rh has a relatively high work function of about 5 eV and generates gallide as a gallium compound after annealing, thus it is possible to form an excellent ohmic contact electrode on p-type GaN; however, Rh has a low reflectivity against light compared to Al and Ag.

In addition, Ag has a high reflectivity and may form an excellent ohmic contact; however, Ag cannot form an excellent layer due to a thermal instability. In other words, a Ag layer is thermally unstable, thus generates an agglomeration phenomenon at an early stage of annealing. In addition, the Ag layer is changed to void, hillock, and island shapes at a final stage of annealing, resulting in the deterioration of electric and optical characteristics.

Recently, studies of developing an ohmic contact layer of providing a high reflectivity while having a low specific-contact resistance are performed in order to use a light emitting diode as a large area and high capacity light emitting diode, such as a back light of a vehicle and a household lighting.

A Ni/Al structure and a Ni/Ag structure has been provided; however, such a structure cannot form an ohmic contact easily and requires a high operation voltage when operating a light emitting diode, thus generates a large amount of heat.

In addition, US Patent No. 2002/0171087 A1 discloses a Ni/Ag electrode structure and a Au/$NiO_x$/Al electrode structure. However, such an electrode structure has a low adherence and a low light emitting efficiency doe to scattered reflection.

SUMMARY OF THE INVENTION

The present invention provides a flip-chip light emitting diode (FCLED) having an excellent electric characteristic by applying an ohmic contact electrode having thermal stability and high reliability and a method of manufacturing the same.

According to an aspect of the present invention, there is provided an FCLED having an active layer interposed between an n-type cladding layer and a p-type cladding layer, comprising a reflective layer formed of a solute element added silver (Ag) on the p-type cladding layer.

The solute element may be at least one selected from the group consisting of aluminum (Al), palladium (Pd), copper (Cu), chrome (Cr), zinc (Zn), rhodium (Rh), nickel (Ni), indium (In), tin (Sn), cobalt (Co), magnesium (Mg), ruthenium (Ru), iridium (Ir), platinum (Pt), gold (Au), plumbum (Pb), manganese (Mn), rhenium (Re), molybdenum (Mo), tungsten (W), vanadium (V), niobium (Nb), titanium (Ti), zirconium (Zr), hafnium (Hf), tantalum (Ta), scandium (Sc), yttrium (Y), beryllium (Be), and lanthanum (La) based elements.

An Ag agglomeration preventing layer (APL) may be formed on the reflective layer, and the Ag APL may be formed of at least one selected from the group consisting of Ni, Ag, Zn, Mg, Pt, Cu, Pt, Ti, W, Mo, Ta, V, Re, the alloys thereof, and titanium nitride (TiN).

In addition, the FCLED may further comprise a surface stabilization layer interposed between the reflective layer and the p-type cladding layer, and the surface stabilization layer may be formed of any one selected from the group consisting of Ni, Zn, Cu, and Mg, the alloys thereof, and a transparent conducting oxide formed of any one of In, Zn, Sn, cu, Ag, Ga, and cadmium (Cd), and oxygen.

The FCLED may further comprise a diffusion preventing layer formed of Ag between the reflective layer and the p-type cladding layer to prevent the solute element from diffusing to the surface of the p-type cladding layer when annealing the reflective layer.

According to another aspect of the present invention, there is provided a method of manufacturing an FCLED having an active layer interposed between an n-type cladding layer and a p-type cladding layer, comprising forming a reflective layer by using a solute element added Ag on the p-type cladding layer of a light emitting structure in which the n-type cladding layer, the active layer, and the p-type cladding layer are sequentially deposited on a substrate, and annealing the resultant structure.

The method may further comprise forming an Ag APL on the reflective layer, and the Ag APL may be formed of at least one selected from the group consisting of Ni, Ag, Zn, Mg, Pt, Cu, Pt, Ti, W, Mo, Ta, V, Re, the alloys thereof, and TiN.

The method may further comprise forming a surface stabilization layer on the p-type cladding layer before forming the reflective layer.

The method may further comprise forming a diffusion preventing layer by using Ag on the p-type cladding layer before forming the reflective layer to prevent the element of the reflective layer from diffusing to the surface of the p-type cladding layer when annealing the reflective layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
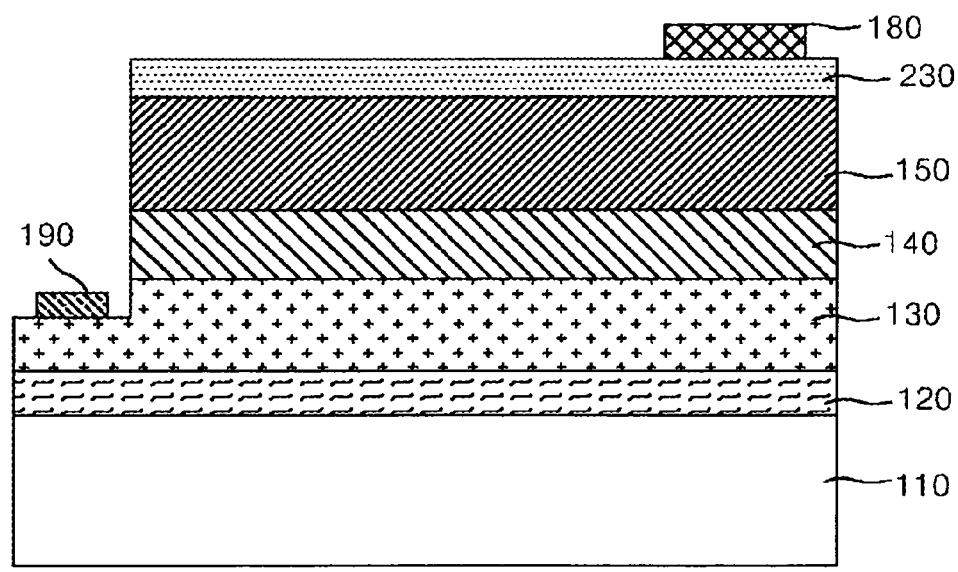
FIG. 1 is a sectional view of a light emitting diode according to a first embodiment of the present invention.

FIG. 1 is a sectional view of a flip-chip light emitting diode (FCLED) according to a first embodiment of the present invention.

Referring to FIG. 1, an FCLED includes a substrate 110, a buffer layer 120, an n-type cladding layer 130, an active layer 140, a p-type cladding layer 150, and a reflective layer 230. Reference numerals 180 and 190 denote a p-type electrode pad and an n-type electrode pad, respectively.

The layers of the substrate 110 through the p-type cladding layer 150 are referred to as a light emitting structure, and the reflective layer 230 formed on the p-type cladding layer 150 is referred to as a p-type electrode structure.

The substrate 110 may be formed of any one of sapphire ($Al_2O_3$), silicon carbide (SiC), silicon (Si), and gallium arsenic (GaAs).

The buffer layer 120 may be omitted.

The layers of the buffer layer 120 through the p-type cladding layer 150 are formed of a compound, which is selected from compounds represented as the formula of a general group III nitride based compound, in other words, $Al_xIn_yGa_zN$ ($0 \leq x \leq 1$, $0 \leq y \leq 1$, $0 \leq z \leq 1$, $0 \leq x+y+z \leq 1$). In addition, corresponding dopants are added to the n-type cladding layer 130 and the p-type cladding layer 150.

The active layer 140 may be formed by a single layer or an MQW layer.

For example, when a gallium nitride (GaN) based compound semiconductor is used, the buffer layer 120 is formed of GaN, and the n-type cladding layer 130 is formed by adding an n-type dopant, such as Si, Ge, Se, or Te to GaN. In addition, the active layer 140 is formed of InGaN/GaN MQW or AlGaN/GaN MQW, and the p-type cladding layer 150 is formed by adding a p-type dopant, such as magnesium (Mg), zinc (Zn), calcium (Ca), strontium (Sr), or boron (Ba) to GaN.

An n-type ohmic contact layer (not shown) may be interposed between the n-type cladding layer 130 and the n-type electrode pad 190, and the n-type ohmic contact layer may be formed by sequentially depositing titanium (Ti) and aluminum (Al).

The p-type electrode pad 180 may be formed by sequentially depositing nickel (Ni)/gold (Au) or silver (Ag)/Au.

Each layer may be formed by e-beam evaporator, physical vapor deposition (PVD), chemical vapor deposition (CVD), plasma laser deposition (PLD), dual-type thermal evaporator, or sputtering.

The reflective layer 230 may be formed of a material, which has a high reflectivity, increases the effective carrier concentration of the p-type cladding layer 150, and easily reacts with the element of the p-type cladding layer 150, except for nitrogen (N), for example, Ga or Al. For example, when a GaN based compound is used for the p-type cladding layer 150, the reflective layer 230 is formed of a material, which reacts with Ga better than with N.

In this case, a large amount of Ga or Al vacancies are formed on the surface of the p-type cladding layer 150 due to the reaction between the Ga of the p-type cladding layer 150 and the reflective layer 230. The Ga or Al vacancies formed on the p-type cladding layer 150 operate as a p-type dopant, thus the effective p-type carrier concentration is increased on the surface of the p-type cladding layer 150.

In addition, the reflective layer 230 is formed of a material that remains on the surface of the p-type cladding layer 150 and deoxidizes gallium oxide (Ga—O), aluminum oxide (Al—O), and magnesium oxide (Mg—O), which operate as a barrier of the flow of carriers on the interface between the reflective layer 230 and the p-type cladding layer 150, to reduce the height and width of a Schottky barrier while being oxidized and phase changed to a conductive oxide. The material of forming Ga vacancies on the surface of the p-type GaN, deoxidizing the oxide layers, and being changed into a conductive oxide may generate a tunneling conductivity on the interface between a GaN semiconductor and a contact metal electrode.

In the embodiment of the present invention, the alloy of Ag to which a solute element is added is used as the reflective layer 230, in order to improve the thermal instability of Ag.

Examples of the solute element applied to the reflective layer 230 include at least one of Al, palladium (Pd), copper (Cu), chrome (Cr), Zn, rhodium (Rh), Ni, indium (In), tin (Sn), cobalt (Co), Mg, ruthenium (Ru), iridium (Ir), platinum (Pt), Au, plumbum (Pb), manganese (Mn), rhenium (Re), molybdenum (Mo), tungsten (W), vanadium (V), niobium (Nb), titanium (Ti), zirconium (Zr), hafnium (Hf), tantalum (Ta), scandium (Sc), yttrium (Y), beryllium (Be), and lanthanum (La) based elements that are difficult to form a compound with Ag when annealing.

The amount of the solute metal added to Ag, which is the main element of the reflective layer 230, in other words, the matrix of the reflective layer 230, is determined to secure a thermal stability in an annealing and to form an excellent ohmic contact with the p-type cladding layer 150, for example, p-type GaN. In other words, 0.001 to 49 weight % of solute element is added to Ag. In this case, the weight % denotes the weight ratio of the added element.

In addition, the reflective layer 230 may be formed to a thickness of 100 to 1,000 nanometers.

Such a reflective layer 230 may be formed by e-beam evaporator, thermal evaporator, sputtering deposition, or pulsed laser deposition.

The deposition temperature for forming the reflective layer 230 is 20 to 1,500° C., and the pressure of an evaporator is atmosphere to $10^{-12}$ Torr.

In addition, an annealing may be performed after depositing the reflective layer 230 in order to improve the electric and mechanical characteristics of the reflective layer 230.

The annealing is performed at a temperature of 100 to 800° C. under a vacuum or gas atmosphere for 10 seconds to 3 hours.

Examples of a gas input to a reactor in the annealing include at least one of N, argon (Ar), helium (He), oxygen (O), hydrogen (H), and air.

Figure 2:
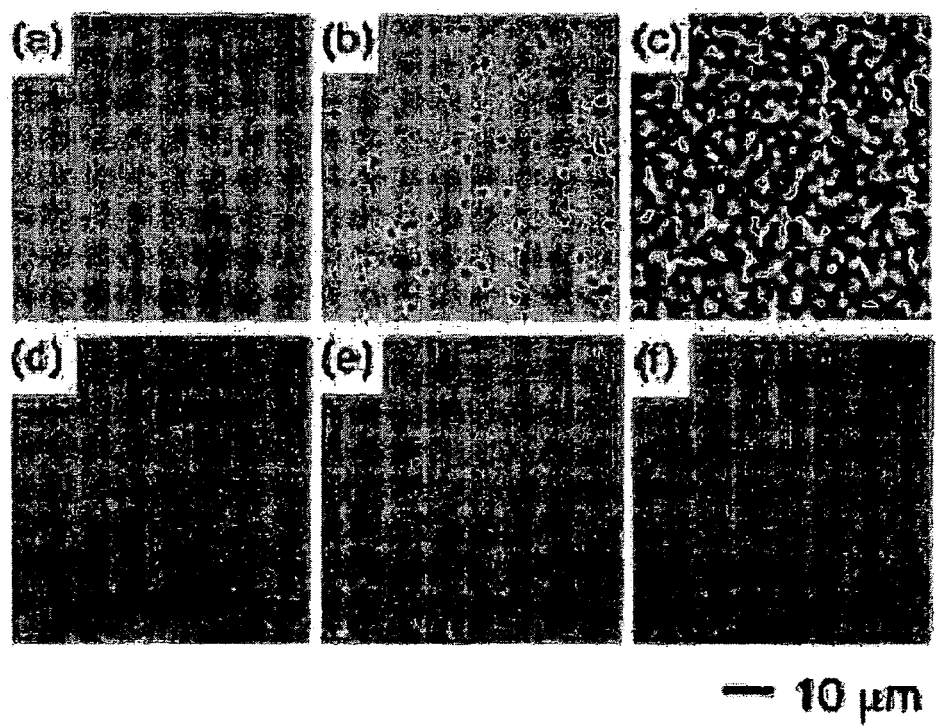
FIG. 2 is photographs illustrating results of experiments showing thermal stabilities of reflective layers to which aluminum added silver is applied according to the embodiment of the present invention and pure silver is applied.

The result of an experiment for comparing thermal stabilities of the reflective layer 230 according to the embodiment of the present invention and a reflective layer formed of Ag only is shown in FIG. 2.

Reference characters a), b), and c) in FIG. 2 denote the photographs of reflective layers, which are formed of pure Ag and annealed at temperatures of a normal temperature, 400° C., and 600° C. under a vacuum state, respectively. In addition, reference characters d), e), and f) in FIG. 2 denote the photographs of reflective layers, which are formed of Ag to which Al is added as a solute element and annealed at temperatures of a normal temperature, 400° C., and 600° C. under a vacuum state, respectively.

Referring to FIG. 2, in the case of the reflective layer formed of Ag only, agglomeration occurs at a temperature of 400° C. and the Ag reflective layer is dissolved at a temperature of 600° C. However, in the case of the reflective layer formed of Ag and Al, the reflective layer is thermally stable under a temperature of 600° C.

In addition, an agglomeration preventing layer (APL) may be formed on the reflective layer 230 in order to prevent the agglomeration of the reflective layer 230.

Figure 3:
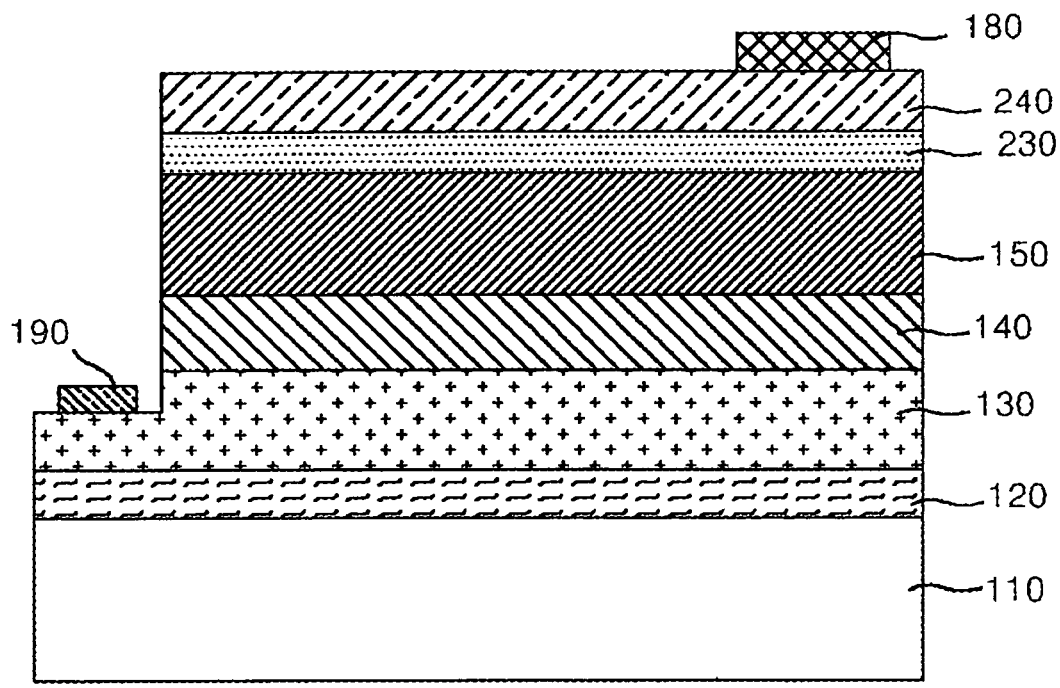
FIG. 3 is a sectional view of a light emitting diode according to a second embodiment of the present invention.

Such a structure is shown in FIG. 3. The same elements of FIG. 1 will be referred to as the same reference numerals in FIG. 3.

Referring to FIG. 3, an APL 240 is formed on a reflective layer 230, in a light emitting diode.

In this case, a p-type electrode structure includes the reflective layer 230 and the APL 240.

The APL 240 may be formed of a material of preventing the agglomeration of Ag or the alloy of Ag that forms the reflective layer 230.

The examples of the APL 240 may include at least one of Ni, the alloy of Ni, or the solid solution of Ni; Ag, the alloy of Ag, or the solid solution of Ag; Zn, the alloy of Zn, or the solid solution of Zn; Mg, the alloy of Mg, or the solid solution of Mg; Pt, the alloy of Pt, or the solid solution of Pt; Cu, the alloy of Cu, or the solid solution of Cu; and TiN, refractory metal, the alloy of TiN, or the solid solution of TiN.

In this case, the example of the refractory metal includes any one of Ti, W, Mo, Ta, V, and Re.

In addition, a diffusion preventing layer may be interposed between the p-type cladding layer 150 and the reflective layer 230 to prevent the diffusion of the alloy of Ag or the solid solution of Ag, which consists the reflective layer 230, in order to prevent the deterioration of the electric and optical characteristics of a light emitting diode.

Figure 4:
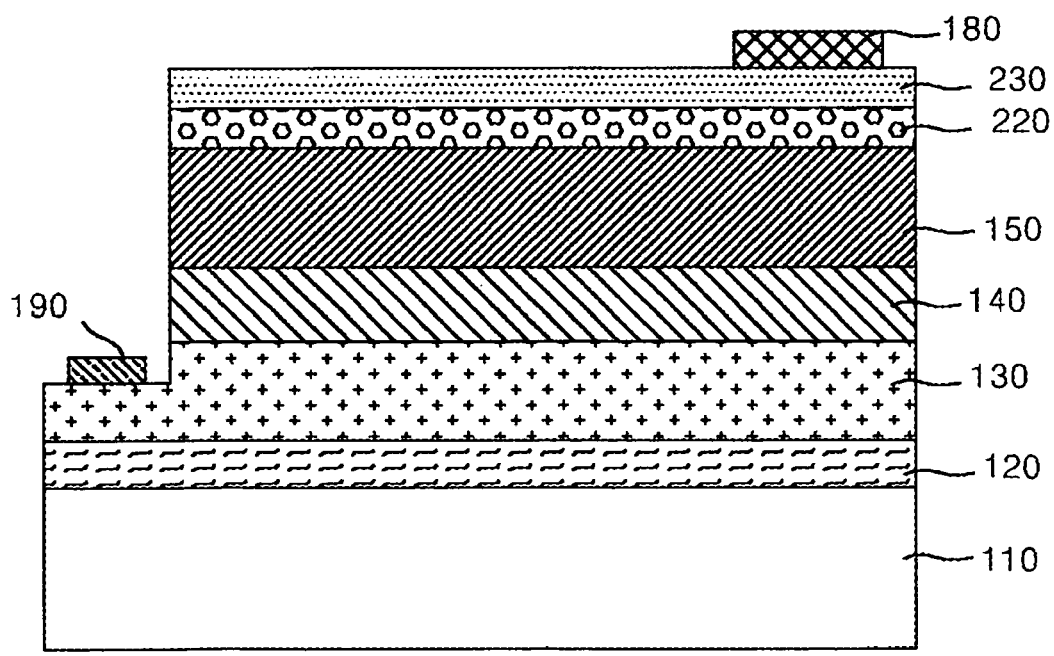
FIG. 4 is a sectional view of a light emitting diode according to a third embodiment of the present invention.

Such a structure is shown in FIG. 4.

Referring to FIG. 4, a diffusion preventing layer 220 is interposed between a p-type cladding layer 150 and a reflective layer 230 of a light emitting diode.

The diffusion preventing layer 220 may be formed of Ag only.

The diffusion preventing layer 220 formed of Ag prevents the diffusion of the alloy of Ag or the solid solution of Ag, which consists the reflective layer 230, to the p-type cladding layer 150 when forming the reflective layer 230, in order to prevent the deterioration of the electric and optical characteristics of the light emitting diode.

The diffusion preventing layer 220 may be formed to a thickness of 10 to 1,000 nanometers.

Figure 5:
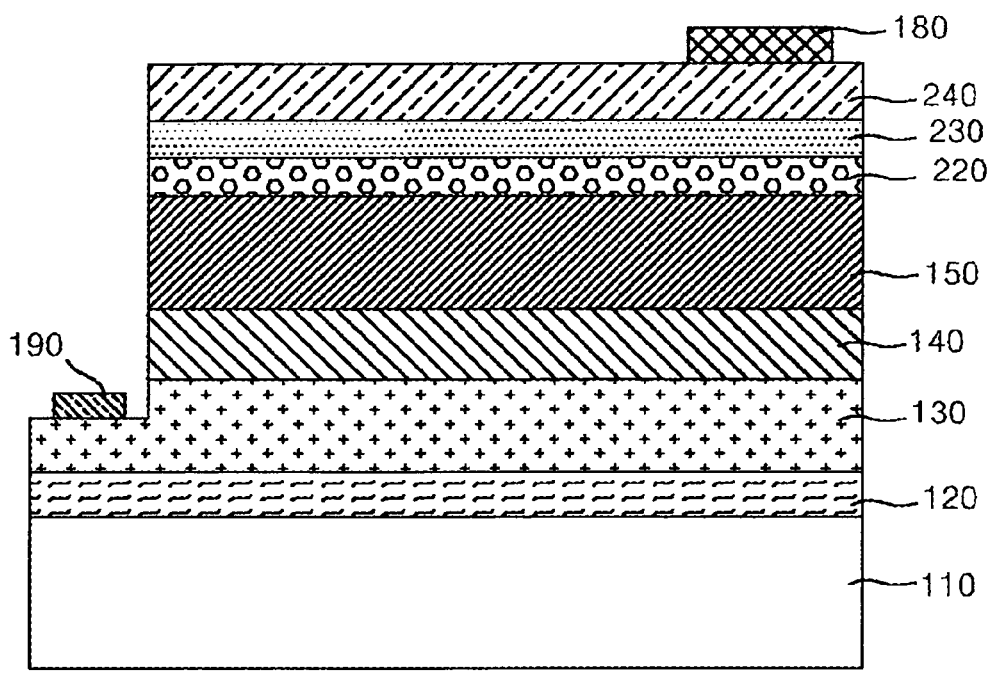
FIG. 5 is a sectional view of a light emitting diode according to a fourth embodiment of the present invention.

Such a diffusion preventing layer 220 may be applied to the structure of FIG. 3, and a resultant structure is shown in FIG. 5.

Figure 6:
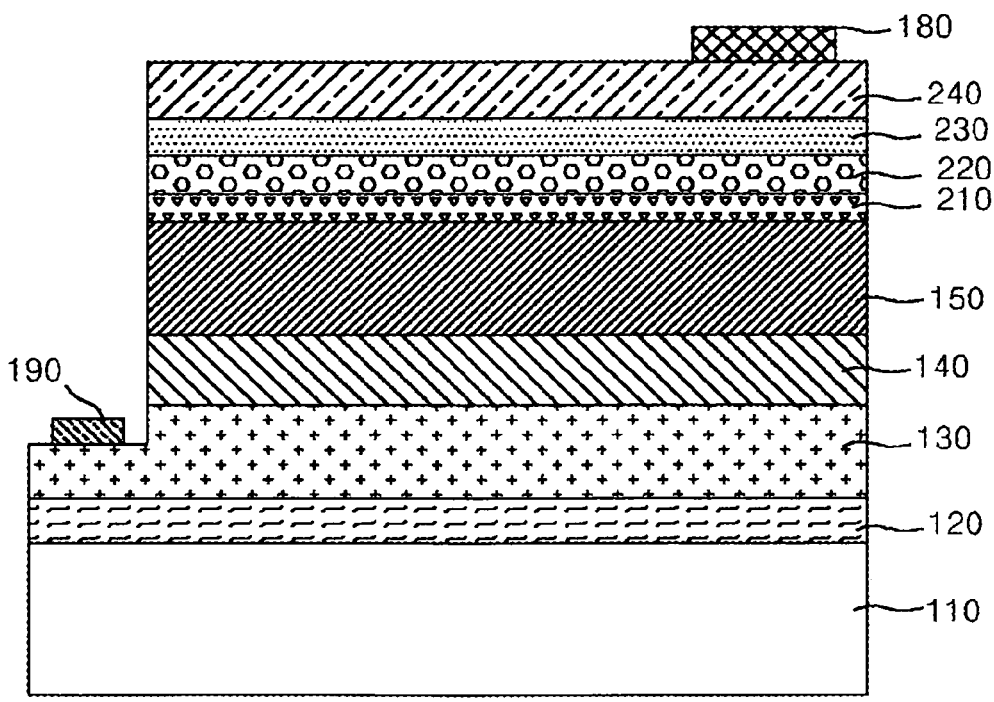
FIG. 6 is a sectional view of a light emitting diode according to a fifth embodiment of the present invention.

FIG. 6 is a sectional view of a light emitting diode according to a fifth embodiment of the present invention.

Referring to FIG. 6, a light emitting diode according to the fifth embodiment of the present invention includes a surface stabilization layer 210, a diffusion preventing layer 220, a reflective layer 230, and an APL 240 that are sequentially deposited on a p-type cladding layer 150.

In this case, a p-type electrode structure includes the surface stabilization layer 210, the diffusion preventing layer 220, the reflective layer 230, and the APL 240.

The surface stabilization layer 210 is applied to secure the thermal stability of Ag, the alloy of Ag, or the solid solution of Ag, which is included in the diffusion preventing layer 220 or the reflective layer 230.

The surface stabilization layer 210 may be formed of at least one of Ni, Zn, Cu, Mg, the alloys thereof, and the solid solutions thereof, and a transparent conducting oxide of at least one of In, Zn, Sn, Cu, Ag, Ga, and Cd, and oxygen.

In addition, when the surface stabilization layer 210 is formed of a transparent conducting oxide, a dopant may be added to the surface stabilization layer 210 in order to improve the electric and optical characteristics of the light emitting diode.

The surface stabilization layer 210 may be formed to a thickness of less than 10 nanometers.

In addition, the light emitting diode according to the second through fifth embodiments of the present invention shown in FIGS. 3 through 6 are formed by depositing the corresponding p-type electrode structures on a light emitting structure, which is formed of a substrate 110 through a p-type cladding layer 150, and performing an annealing.

When the annealing is performed, an optical characteristic, such as a light transmittance, and an electric characteristic, such as a current-voltage characteristic, may be improved.

As described above, according to an FCLED and a method of manufacturing the same according to the embodiments of the present invention, the thermal stability of the FCLED is improved to improve an ohmic contact characteristic to a p-type cladding layer, thus a wire bonding efficiency and yield are improved when packaging the light emitting diode. In addition, the light emitting efficiency and the lifespan of the light emitting diode can be improved due to a low specific-contact resistance and an excellent current-voltage characteristic.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flip-chip light emitting diode (FCLED) having an active layer interposed between an n-type cladding layer and a p-type cladding layer, the FCLED comprising a reflective layer formed of a solute element added silver (Ag) on the p-type cladding layer, wherein the solute element is at least one selected from the group consisting of aluminum (Al), palladium (Pd), copper (Cu), chrome (Cr), zinc (Zn), rhodium (Rh), nickel (Ni), indium (In), tin (Sn), cobalt (Co), magnesium (Mg), ruthenium (Ru), iridium (Ir), platinum (Pt), gold (Au), plumbum (Pb), manganese (Mn), rhenium (Re), molybdenum (Mo), tungsten (W), vanadium (V), niobium (Nb), titanium (Ti), zirconium (Zr), hafnium (Hf), tantalum (Ta), scandium (Sc), yttrium (Y), beryllium (Be), and lanthanum (La) based elements.

2. A flip-chip light emitting diode (FCLED) having an active layer interposed between an n-type cladding layer and a p-type cladding layer, the FCLED comprising a reflective layer formed of a solute element added silver (Ag) on the p-type cladding layer, and further comprising an Ag agglomeration preventing layer (APL) formed on the reflective layer, and the Ag APL is formed of at least one selected from the group consisting of Ni, Ag, Zn, Mg, Pt, Cu, Pt, Ti, W, Mo, Ta, V, Re, alloys thereof, and titanium nitride (TiN).

3. A flip-chip light emitting diode (FCLED) having an active layer interposed between an n-type cladding layer and a p-type cladding layer, the FCLED comprising a reflective layer formed of a solute element added silver (Ag) on the p-type cladding layer, and further comprising a surface stabilization layer interposed between the reflective layer and the p-type cladding layer, wherein the surface stabilization layer is formed of any one selected from the group consisting of Ni; Zn; Cu; Mg, alloys of Ni, Zn, Cu, Mg; and a transparent conducting oxide formed of any one of In, Zn, Sn, Cu, Ag, Ga, and Cd.

4. The FCLED of claim 1, further comprising a diffusion preventing layer formed of Ag between the reflective layer and the p-type cladding layer to prevent the solute element from diffusing to the surface of the p-type cladding layer when annealing the reflective layer.

* * * * *